United States Patent
Le et al.

(10) Patent No.: US 12,405,323 B2
(45) Date of Patent: Sep. 2, 2025

(54) MAGNETIC SENSOR HALF-BRIDGE BASED ON INVERSE SPIN HALL EFFECT WITH REDUCED THERMAL DRIFT

(71) Applicant: Western Digital Technologies, Inc., San Jose, CA (US)

(72) Inventors: Quang Le, San Jose, CA (US); Xiaoyong Liu, San Jose, CA (US); Hisashi Takano, Fujisawa (JP); Brian R. York, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 146 days.

(21) Appl. No.: 18/545,847

(22) Filed: Dec. 19, 2023

(65) Prior Publication Data
US 2025/0199093 A1    Jun. 19, 2025

(51) Int. Cl.
*G01R 33/07* (2006.01)

(52) U.S. Cl.
CPC ............................ *G01R 33/07* (2013.01)

(58) Field of Classification Search
CPC .... G01R 33/07; G01R 33/075; G01R 33/093; G01R 33/098; G01R 1/203; G01R 1/20;
(Continued)

(56) References Cited

U.S. PATENT DOCUMENTS 6,771,472 B1 * 8/2004 Mao .................. G11B 5/3906
324/207.21
9,285,439 B2   3/2016 Motz et al.
(Continued)

FOREIGN PATENT DOCUMENTS

CN        112082579 A      12/2020
DE    102010018874 A1      11/2011
(Continued)

OTHER PUBLICATIONS

Luo, Keliu et al., "Implementation of a full Wheatstone-bridge GMR sensor by utilizing spin-orbit torque induced magnetizationswitching in synthetic antiferromagneticlayer", Journal of Applied Physics, 2023, <https://doi.org/10.1063/5.0137559>.
(Continued)

*Primary Examiner* — Alvaro E Fortich
(74) *Attorney, Agent, or Firm* — PATTERSON + SHERIDAN, LLP

(57) ABSTRACT

The present disclosure generally relates to a magnetic sensor half bridge circuit. The half bridge circuit comprises a bias source connected to a first leg and a second leg. The first leg comprises one or more first spin-orbit torque (SOT) structures connected in series, each first SOT structure comprising a first ferromagnetic (FM) layer disposed on a first SOT layer. The first SOT layer has a first end connected to ground and a second end connected to a first voltage sensor. The second leg comprises one or more second SOT structures connected in series, each second SOT structure comprising a second FM layer disposed on a second SOT layer. The second SOT layer has a first end connected to a second voltage sensor and a second end connected to a ground. The first voltage sensor is disposed adjacent to the second voltage sensor.

21 Claims, 7 Drawing Sheets

(58) Field of Classification Search
CPC ... G11C 11/161; G11C 11/1675; H10B 61/00; H10B 53/00; H10B 51/00; H10B 51/50; H10B 51/40; H10B 99/22; H10B 51/30; H10B 10/00; H10N 50/10; H10N 50/80; H01F 10/329; H01F 10/3286; H01F 10/3272; H01F 10/3254

See application file for complete search history.

(56) References Cited

U.S. PATENT DOCUMENTS

| | | | |
|---|---|---|---|
| 10,663,535 B2 | 5/2020 | Motz | |
| 11,204,374 B2 | 12/2021 | Kishi et al. | |
| 2017/0092345 A1 | 3/2017 | Fukuzawa | |
| 2017/0222137 A1 | 8/2017 | Raberg | |
| 2019/0377037 A1 | 12/2019 | Wu et al. | |
| 2020/0082858 A1* | 3/2020 | Kim | G11C 11/1659 |
| 2020/0365652 A1* | 11/2020 | Hong | H10N 50/80 |
| 2021/0063506 A1* | 3/2021 | Wang | G11B 5/3929 |
| 2023/0204692 A1 | 6/2023 | Kwon et al. | |
| 2023/0284538 A1* | 9/2023 | Debashis | H10N 52/01 257/427 |
| 2023/0358826 A1 | 11/2023 | Sousa et al. | |

FOREIGN PATENT DOCUMENTS

| | | |
|---|---|---|
| EP | 3006951 A1 | 4/2016 |
| KR | 2018-0090459 A | 8/2018 |
| WO | 2012136132 A1 | 10/2012 |
| WO | 2013097542 A1 | 7/2013 |

OTHER PUBLICATIONS

International Search Report and Written Opinion for Application No. PCT/US2024/040848 dated Nov. 12, 2024.

* cited by examiner

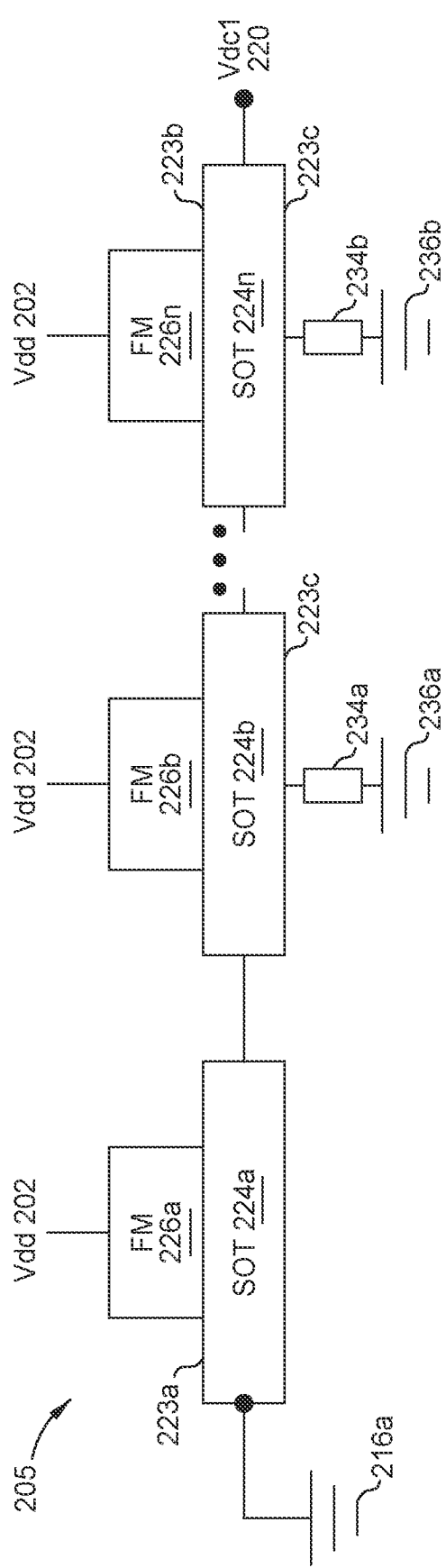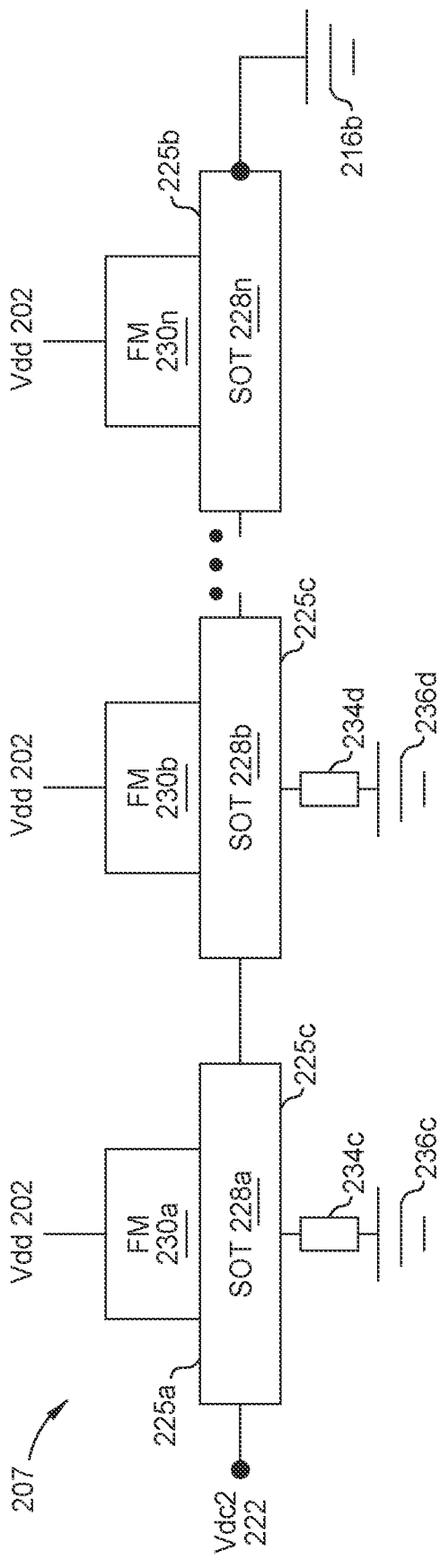

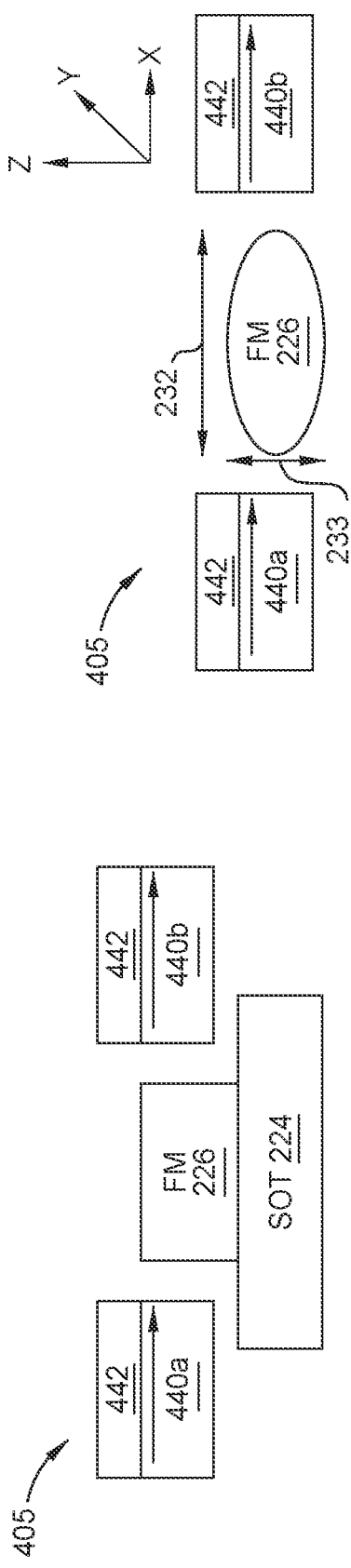
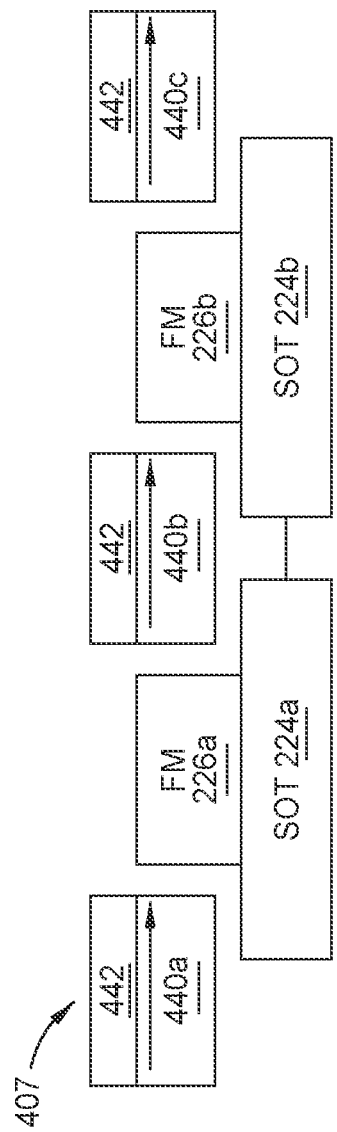

MAGNETIC SENSOR HALF-BRIDGE BASED ON INVERSE SPIN HALL EFFECT WITH REDUCED THERMAL DRIFT

BACKGROUND OF THE DISCLOSURE

Field of the Disclosure

Embodiments of the present disclosure generally relate to a magnetic sensor half bridge.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as a magnetic field sensors where its resistance changes with the magnetic field. Magnetic sensors can include Hall effect magnetic sensors, anisotropy magnetoresistive sensors (AMR), giant magnetoresistive (GMR) sensors, and tunnel magnetoresistive (TMR) sensors.

The Wheatstone bridge has a linear output signal and resists the environment temperature fluctuations. Any temperature change in the Wheatstone bridge array is cancelled. The Wheatstone bridge array has four resistors with one resistor in each leg. Two of the resistors have identical resistance while the remaining two resistors have identical resistances relative to each other, but different from the original two resistors.

It is common practice to build a Wheatstone bridge on a single chip with each leg of the bridge comprising one or more sensors to obtain a higher signal output while minimizing the thermal drift and achieving zero offset. In operation, the bridge uses opposite sensor field responses for adjacent legs (i.e., one leg resistance increases with field while sensors on the adjacent leg produces a reduction of resistance with an externally applied magnetic field. For conventional GMR or TMR based bridge sensors, opposite pinning direction is used between adjacent legs. This can generally lead to significant changes in designs/processes.

The Wheatstone bridge has four legs as noted above. The four legs can take up a significant amount of space. As devices continue to shrink, the bridge needs to shrink as well.

Therefore, there is a need in the art for an improved bridge.

SUMMARY OF THE DISCLOSURE

The present disclosure generally relates to a magnetic sensor half bridge circuit. The half bridge circuit comprises a bias source connected to a first leg and a second leg. The first leg comprises one or more first spin-orbit torque (SOT) structures connected in series, each first SOT structure comprising a first ferromagnetic (FM) layer disposed on a first SOT layer. The first SOT layer has a first end connected to ground and a second end connected to a first voltage sensor. The second leg comprises one or more second SOT structures connected in series, each second SOT structure comprising a second FM layer disposed on a second SOT layer. The second SOT layer has a first end connected to a second voltage sensor and a second end connected to a ground. The first voltage sensor is disposed adjacent to the second voltage sensor.

In one embodiment, a half bridge circuit comprises a first spin-orbit torque (SOT) layer having a first end and a second end opposite the first end, a first ferromagnetic (FM) layer disposed on the first SOT layer, a first ground connected to the first end of the first SOT layer, a first voltage sensor connected to the second end of the first SOT layer, a bias source connected to the first FM layer, a second SOT layer having a first end and a second end opposite the first end, a second FM layer disposed on the second SOT layer, the second FM layer being connected to the bias source, a second ground connected to the second end of the second SOT layer, and a second voltage sensor connected to the first end of the second SOT layer.

In another embodiment, a half bridge circuit comprises a bias source, a first leg connected to the bias source, the first leg comprising one or more first spin-orbit torque (SOT) structures, each first SOT structure comprising: a first SOT layer having a first end and a second end opposite the first end, a first ferromagnetic (FM) layer disposed on the first SOT layer, a first ground connected to the first end of the first SOT layer, and a first voltage sensor connected to the second end of the first SOT layer, and a second leg connected to the bias source, the second leg comprising one or more second SOT structures, each second SOT structure comprising: a second SOT layer having a first end and a second end opposite the first end, a second FM layer disposed on the second SOT layer, a second ground connected to the second end of the second SOT layer, and a second voltage sensor connected to the first end of the second SOT layer.

In yet another embodiment, a half bridge circuit comprises a bias source, a first leg connected to the bias source, the first leg comprising one or more first spin-orbit torque (SOT) structures connected in series, each first SOT structure comprising: a first SOT layer having a first end and a second end opposite the first end, a first ferromagnetic (FM) layer disposed on the first SOT layer, a second FM layer disposed below the first SOT layer, a first ground connected to the first end of the first SOT layer, and a first voltage sensor connected to the second end of the first SOT layer, and a second leg connected to the bias source, the second leg comprising one or more second SOT structures connected in series, each second SOT structure comprising: a second SOT layer having a first end and a second end opposite the first end, wherein the first end of the second SOT layer is disposed adjacent to the second end of the first SOT layer, a third FM layer disposed on the second SOT layer, a fourth FM layer disposed below the second SOT layer, a second ground connected to the second end of the second SOT layer, and a second voltage sensor connected to the first end of the second SOT layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A and 3B are schematic illustrations of legs of the half bridge design of FIG. 2B according to one embodiment.

FIG. 4A is a schematic cross section illustration of a single ferromagnetic (FM) layer bridge according to one embodiment.

FIG. 4B is a schematic top view of FIG. 4A.

FIG. 4C is a schematic side view of a leg having an array of sensors according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a magnetic sensor half bridge circuit. The half bridge circuit comprises a bias source connected to a first leg and a second leg. The first leg comprises one or more first spin-orbit torque (SOT) structures connected in series, each first SOT structure comprising a first ferromagnetic (FM) layer disposed on a first SOT layer. The first SOT layer has a first end connected to ground and a second end connected to a first voltage sensor. The second leg comprises one or more second SOT structures connected in series, each second SOT structure comprising a second FM layer disposed on a second SOT layer. The second SOT layer has a first end connected to a second voltage sensor and a second end connected to a ground. The first voltage sensor is disposed adjacent to the second voltage sensor.

Figure 1:
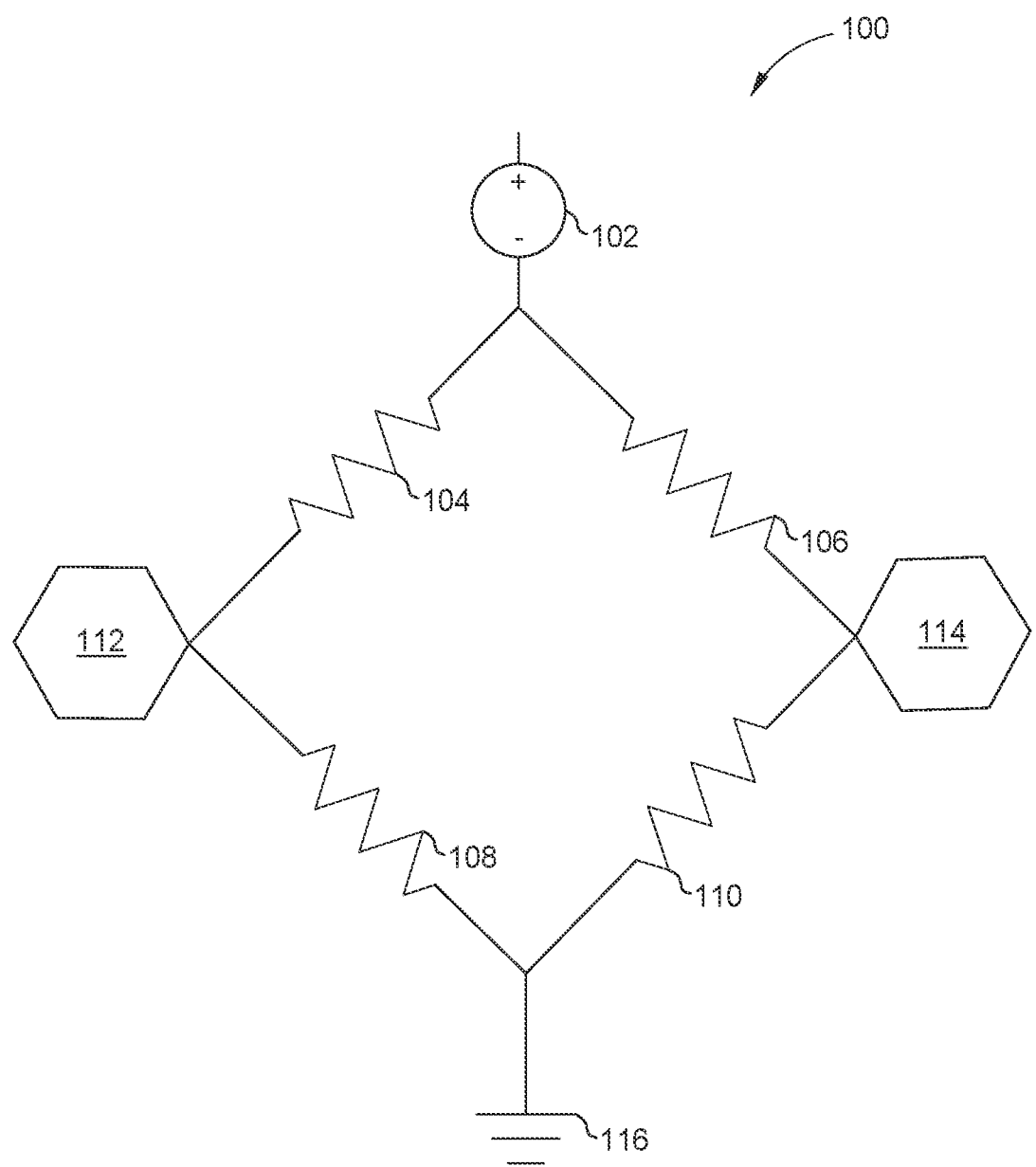
FIG. 1 is a schematic illustration of a Wheatstone bridge array design.

FIG. 1 is a schematic illustration of a Wheatstone bridge array 100 design. The array 100 includes a bias source 102, a first resistor 104, a second resistor 106, a third resistor 108, a fourth resistor 110, a first sensing port 112, a second sensing port 114, and a ground connection 116. Bias voltage is applied across the array from the bias source 102 to the ground connection 116. The first sensing port 112 and the second sensing port 114 sense the output of the applied voltage. Any temperature change from the resistors 104, 106, 108, 110 can be cancelled.

As discussed herein, the resistors 104, 106, 108, 110 each include a sensor, such as a tunneling magnetoresistance (TMR) sensor. The TMR sensors may each be distinct and different such that the resistors 104, 106, 108, 110 have different resistance. The sensors may be identical, but the resistors 104, 106, 108, 110 are different. Resistors 104, 110 may be identical to each other (as are the TMR sensors that comprise the resistors 104, 110), and resistors 106, 108 are identical to each other (as are the sensors that comprise the resistors 106, 108) yet different from resistors 104, 110. For a TMR sensor in array 100, the RA for the array 100 is around 100 Ohms microns$^2$.

Typical magnetic field sensors use MR (magnetoresistance) devices, like TMR devices, in a Wheatstone bridge circuit. The sensor requires the MR devices to change differently in adjacent legs of the bridge. One way is to make a magnetic field sensor is to fabricate two different TMR films with opposite pinning directions on the in the same wafer and anneal wafers in multiple temperatures/field conditions. The reliability and performance of the TMR films determines the magnetoresistance response. In this way, combined with different TMR films features, a perfect Wheatstone bridge design for magnetic field sensor can be fabricated. However, it will introduce significant amounts of wafer/device processing complexity.

Figure 2A:
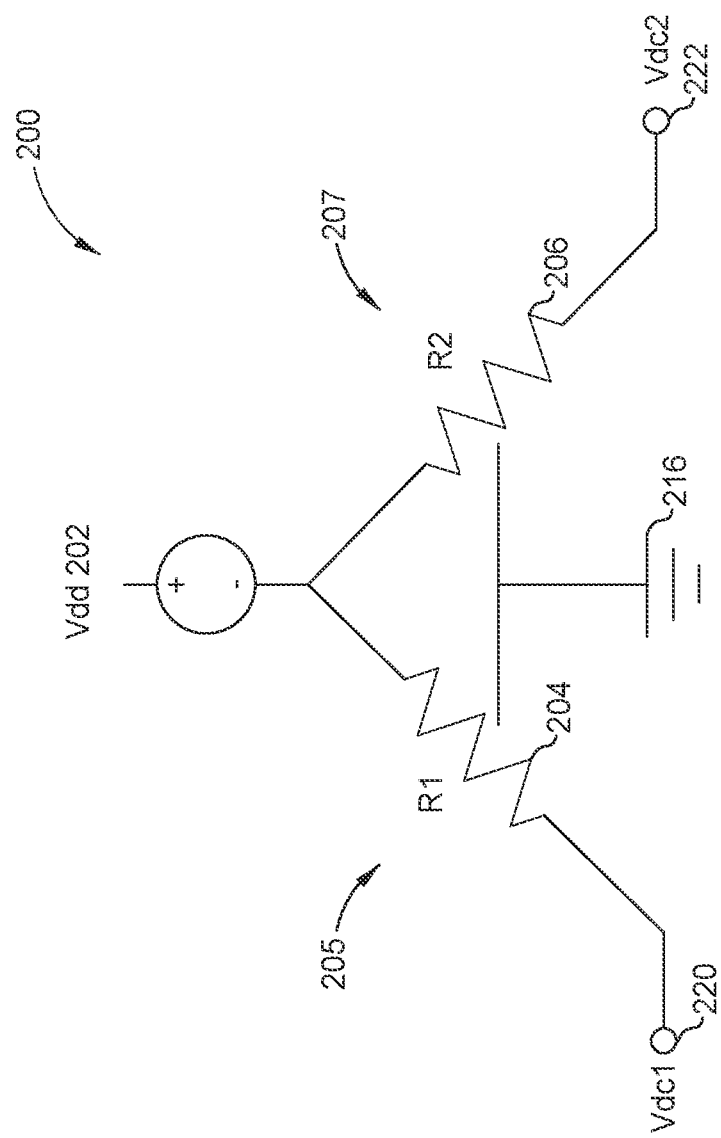
FIGS. 2A and 2B are schematic illustrations of a half bridge circuit diagram, according to one embodiment.
Figure 2B:
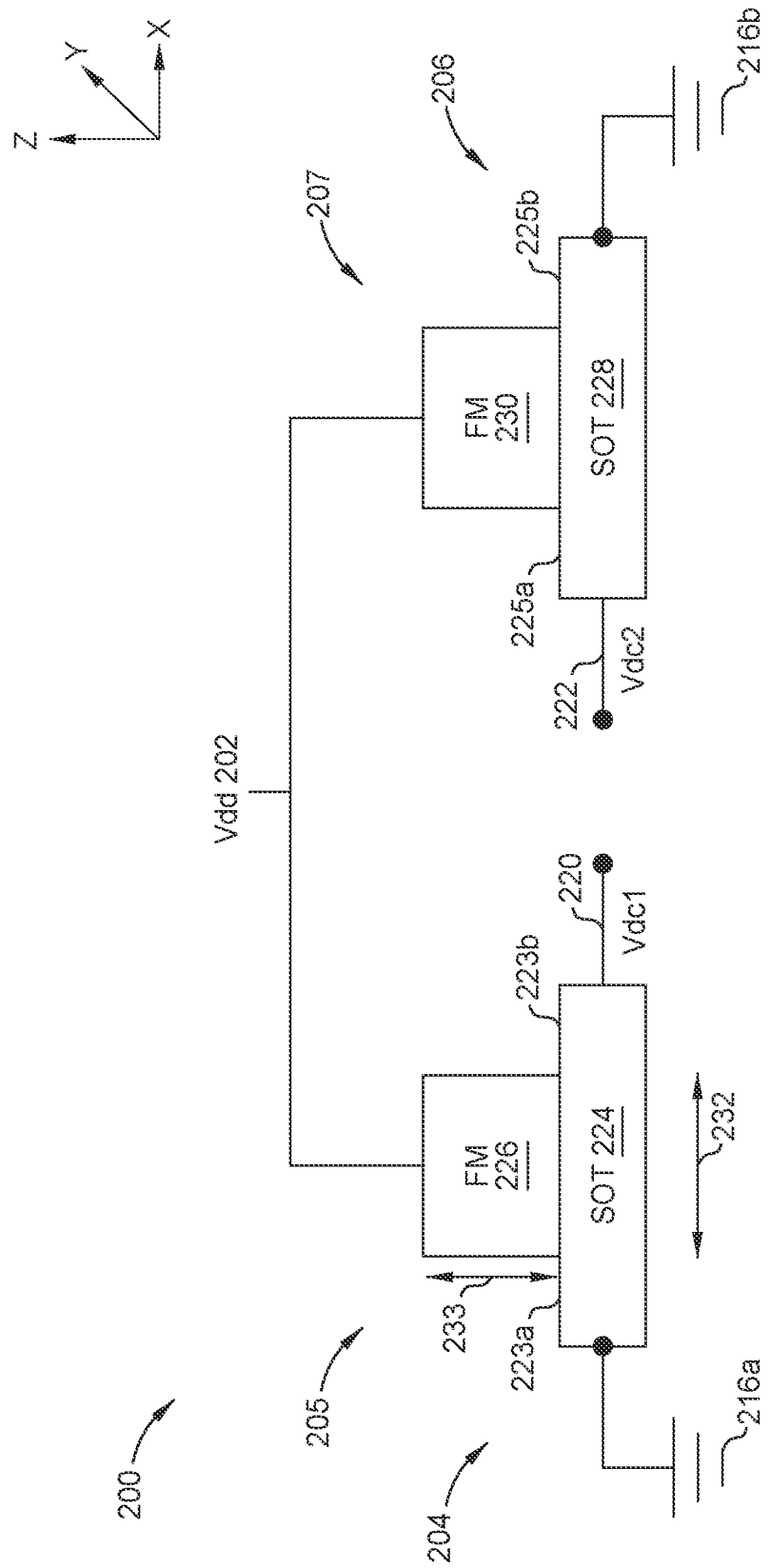

FIGS. 2A-2B are a schematic illustrations of a half bridge circuit diagram 200 of a magnetic sensor, according to one embodiment. The half bridge circuit 200 may be referred to herein as a magnetic sensor 200.

The half bridge circuit 200 comprises a first leg 205 comprising a first three-terminal spin-orbit torque (SOT) resistor (R1) 204 connected to a bias source (Vdd) 202, a first voltage sensor (Vdc1) 220, and to ground 216. The half bridge circuit 200 further comprises a second leg 207 comprising a second three-terminal SOT resistor (R2) 206 connected to the bias source 202, a second voltage sensor (Vdc2) 222, and to ground 216. The first and second resistors 204, 206 may be connected to different ground sources 216a, 216b, like shown in FIG. 2B. In such embodiments, the first leg 205 comprises the first resistor 204, the ground 216a, and the first voltage sensor 220, and the second leg 207 comprises the second resistor 206, the ground 216b, and the second voltage sensor 222. The first and second resistors 204, 206 are connected to one another in series. The resistors 204, 206 may be referred to as SOT structures. All elements and components of the half bridge circuit 200 can be deposited and fabricated on the same wafer, avoiding the complexity as described in TMR sensor based full Wheatstone bridges.

As shown in FIG. 2B, the first resistor 204 comprises an SOT layer 224a and a ferromagnetic (FM) layer 226. A first end 223a of the SOT layer 224 is connected to ground 216a, and a second end 223b of the SOT layer 224a is connected to the first voltage sensor 220. The FM layer 226 is disposed on the SOT layer 224 (with possible intervening layers not shown, as will be the case for the following figures) and connected to the bias source 202. The second resistor 206 comprises an SOT layer 228 and an FM layer 330. A first end 225a of the SOT layer 228 is connected to the second voltage sensor 222, and a second end 225b of the SOT layer 228 is connected to ground 216b. The FM layer 230 is disposed on the SOT layer 228 (with possible intervening layers not shown, as will be the case for the following figures) and connected to the bias source 202. The FM layers 226, 230 are stabilized such that the FM layers 226, 230 are magnetized in the x-direction. More generally, a layer described as being disposed on another layer does not require the two layers to be in contact, and one or more intervening layers may be present in between.

The second end 223a of the SOT layer 224 of the first resistor 204 is disposed adjacent to the first end 225a of the SOT layer 228 of the second resistor 206 such that the first voltage sensor 202 is disposed adjacent to the second voltage sensor 222. As such, the ground 216a and the ground 216b are disposed on opposite ends of the SOT layers 224, 228. The SOT layers 224 and 228 are substantially the same, and the FM layers 226 and 230 are substantially the same. This enables the same deposition of whole stack (FM/SOT) all at once and fabrication on the same wafer.

Each FM layer 226, 230 has a width 232 in the x-direction and a height 233 in the y-direction. The width 232 may be greater than the height 233 to utilize shape anisotropy of the FM layers 226, 230. The aspect ratio (width divided by height) is generally greater than or equal to 3. For example, the width 232 may be about 300 nm to about 30 μm and the height 233 may be about 100 nm to about 10 μm. While the FM layers 226, 230 are shown as rectangular, the FM layers 226, 230 may instead be elliptical in shape, like discussed below in FIG. 4B.

The FM layers 226, 230 may each individually comprise NiFe, CoFe, NiFeX, CoFeX, FeX, or Nix, where X=Co, Ni, Cu, Si, Al, Mn, Ge, Ta, Hf, N, and B. The FM layers 226, 230 may comprise any magnetic layer combination or alloy combination of these elements that can yield a low coercivity, negative magnetostrictive FM layers 226, 230 or in multilayer combinations with other higher polarizing materials like Heusler alloys or high Ni containing alloy FM layers.

The SOT layers 224, 228 may each individually comprise doped or undoped bismuth antimony (BiSb) of various thicknesses. In one embodiment, the SOT layers 224, 228 comprises undoped BiSb, or doped BiSbX, where X is less than at. 8% and extracted from elements which don't readily interact with either Bi or Sb, such as Cu, Ag, Ge, Mg, Ni, Co Mo, W, Sn, B, N, In, Te, Se, Y, Zr, Pt, Ti, or in alloy combinations thereof, or as ceramic oxide, carbide, or nitride dopants of these elements. The SOT layers 224, 228 may each individually comprise YPtBi.

The bias source 202 provides a perpendicular current passing through the FM layers 226, 230, getting spin polarized and injecting into the SOT layers 224, 228 of the first and second resistors 202, 204 (along the z-direction). Due to the inverse spin Hall effect (iSHE), a DC voltage is induced between the ground 216a, 216b and the first and second voltage sensors 220, 222 longitudinally (along the x-direction). The magnitude of the DC voltage depends on the magnetization components of the FM layers 226, 230 in the y-direction. If the magnetization of the FM layers 226, 230 is 100% along the y-direction, the two DC voltages (Vdc1 and Vdc2) will have a maximum signal. If the magnetization of the FM layers 226, 230 is 100% along the x-direction, the two DC voltages will have zero induced signal.

When an external magnetic field is applied in the y-direction, the magnetizations of the FM layers 226, 230 will rotate such that at the first resistor 204, the first voltage sensor 220 is greater than 0, and at the second resistor 206, the second voltage sensor 222 is less than 0 (or vice versa), resulting in the signal (Vdc2−Vdc1) being doubled. When no external magnetic field is applied or an external field is applied along the x-direction, the magnetizations of the FM layers 226, 230 remain in the x-direction, resulting in no intrinsic signal output besides some thermal drift, as the first and second voltage sensors 220, 222 are equal (Vdc1=Vdc2). This way, the half bridge design 200 is only sensitive to the magnetic field along the y-direction and immune to magnetic fields in any other components.

The half bridge design 200 comprising only two legs 205, 207 is able to achieve the same functionality of the Wheatstone bridge array 100 of FIG. 1 in a more simplistic and straight-forward manner. Because the half bridge circuit 200 utilizes SOT structures without using the TMR effect, it is less likely to breakdown over time (intrinsic reliability concern for TMR sensors). Moreover, the output of the two legs 205, 207 of the half bridge design 200 have opposite polarities, resulting in the signal of the half bridge design 200 to be doubled or boosted. Additionally, any environment/thermal drifts will cause the same changes (both magnitude and polarity) of the Vdc1 and Vdc2, resulting in net cancelation of the signal output.

FIGS. 3A and 3B are schematic illustrations of the legs 205, 207 of the half bridge design 200 of FIG. 2B, according to one embodiment. FIG. 3A illustrates the first leg 205, and FIG. 3B illustrates the second leg 207.

As shown in FIG. 3A, the first leg 205 may comprise a plurality of SOT layers 224a, 224b, 224n (collectively referred to herein as SOT layers 224) with a plurality of FM layers 226a, 226b, 226b (collectively referred to herein as FM layers 226) disposed thereon. The plurality of SOT layers 224a, 224b, 224n are connected together in series. Each FM layer 226a, 226b, 226n is connected to the bias source 202. One SOT layer 224 and the FM layer 226 disposed thereon may be referred to herein as an SOT structure. While three SOT structures are shown, the first leg 205 may comprise any number of SOT structures.

The first SOT layer 224a in the series has a first end 223a connected to the ground 216a. The last SOT layer 224n in the series has a second end 223b connected to the first voltage sensor 220. A bottom surface 223c of the last SOT layer 224n opposite the surface the FM layer 226n is disposed on is further coupled to a resistor 234b and then to ground 236b. Similarly, a bottom surface 223c of each middle SOT layer(s) 224b opposite the surface the FM layer 226b is disposed on is coupled to a resistor 234a and then to ground 236a. Because the first SOT layer 224a is connected to ground 216a on the first end 223a, the first SOT layer 224a does not require a resistor like the middle and last SOT layers 224b, 224n. During operation, the voltage of each of the plurality of SOT layers 224a, 224b, 224n and FM layers 226a, 226b, 226c is added together, increasing the signal output. Moreover, all SOT layers 224a, 224b, 224n and FM layers 226a, 226b, 226c can be deposited and fabricated on the same thin wafer, as SOT layers 224a, 224b, 224n are all the same, and the FM layers 226a, 226b, 226c are all the same.

Similar to the first leg 205, the second leg 207 may comprise a plurality of SOT layers 228a, 228b, 228n (collectively referred to herein as SOT layers 228) with a plurality of FM layers 230a, 230b, 230b (collectively referred to herein as SOT layers 230) disposed thereon. The plurality of SOT layers 228a, 228b, 228n are connected together in series. Each FM layer 230a, 230b, 230b is connected to the bias source 202. While three SOT layers 228a, 228b, 228n and three FM layers 226a, 226b, 226b are shown, the second leg 207 may comprise any number of SOT layers and FM layers. One SOT layer 228 and the FM layer 230 disposed thereon may be referred to herein as an SOT structure.

The last SOT layer 228n in the series has a second end 225a connected to the ground 216b. The first SOT layer 228a in the series has a first end 225a connected to the second voltage sensor 222. A bottom surface 225c of the first SOT layer 228a opposite the surface the FM layer 230a is disposed on is further coupled to a resistor 234c and then to ground 236d. Similarly, a bottom surface 225c of each middle SOT layer(s) 228b opposite the surface the FM layer 228b is disposed on is coupled to a resistor 234d and then to ground 236d. Because the last SOT layer 228n is connected to ground 216b on the second end 225b, the last SOT layer 228n does not require a resistor like the first and middle SOT layers 228a, 228b. During operation, the voltage of each of the plurality of SOT layers 228a, 228b, 228n and FM layers 230a, 230b, 230b is added together, increasing the signal output.

Moreover, all SOT layers 228a, 228b, 228n and FM layers 230a, 230b, 230b can be deposited and fabricated on the same wafer. Further, all SOT layers and FM layers of both the first and second legs 205, 207 can be deposited and fabricated on the same wafer. All SOT layers and FM layers of both the first and second legs 205, 207 may comprise any of the materials discussed above.

FIG. 4A is a schematic cross section illustration of a single ferromagnetic (FM) layer bridge 405, according to one embodiment. FIG. 4B is a schematic top view of FIG. 4A. The single FM layer bridge 405 may be either the first leg 205 or the second leg 207 of FIGS. 2A-3B. For clarity, ground, bias source, and voltage sensors are not shown in the FM layer bridge 405. However, the FM layer bridge 405 may be connected as discussed above in FIGS. 2A-3B.

The FM layer bridge 405 comprises an SOT layer 224 and an FM layer 226 disposed thereon (i.e., one SOT structure). The FM layer 226 is sandwiched between a first bias layer 440a and a second bias layer 440b. The first and second biasing layers 440a, 440b may be either hard bias layers or soft bias layers. The first and second biasing layers 440a, 440b may each individually comprise layers of Co, Pt, Ni, CoPt, CoPtCr, NiFe, CoFe, or combinations thereof. For the case of soft bias material, there is an additional AFM layer 442 disposed on top of the first and second biasing layers 440a, 440b for exchanging bias of the soft bias layer. For case of hard bias layer, the AFM layer 442 can be skipped. The first and second biasing layers 440a, 440b enable the FM layer 226 to have a magnetization in the x-direction when there is no external field applied. The strength of the first and second biasing layers 440a, 440b controls the dynamic range of the overall sensor comprising the FM layer bridge 405. An insulating layer may be disposed between the FM layer 226 and the biasing layers 440a, 440b for electrical isolation. As shown in the side view of FIG. 4B (i.e., viewed from the z-direction), the FM layer 226 may be elliptical or oval in shape, and may utilize shape anisotropy when the width 232 is greater than the height 233.

FIG. 4C is a schematic cross-sectional view of a leg 407 having more than one SOT structure, according to one embodiment. For clarity, ground, bias source, and voltage sensors are not shown in the leg 407. However, the leg 407 may be connected as discussed above in FIGS. 2A-3B. The leg 407 may be either the first or second leg 205, 207 of FIGS. 2A-3B.

The leg 407 is similar to the legs 205, 207 shown in FIGS. 3A-3B. The leg 407 further comprises a first FM layer 226a disposed over a first SOT layer 224a and a second FM layer 226b disposed over a second SOT layer 224b. The first FM layer 226a is disposed between a first biasing layer 440a and a second biasing layer 440b. The second FM layer 226b is disposed between the second biasing layer 440b and a third biasing layer 440c. Thus, the first and second FM layers 226a, 226b can share the second biasing layer 440b, enabling the second biasing layer 440b to bias both FM layers 226a, 226b. While two FM layers 226a, 226b and two SOT layers 224a, 224b are shown, the leg 407 may comprise any number of FM layers, SOT layers, and biasing layers.

Figure 5:
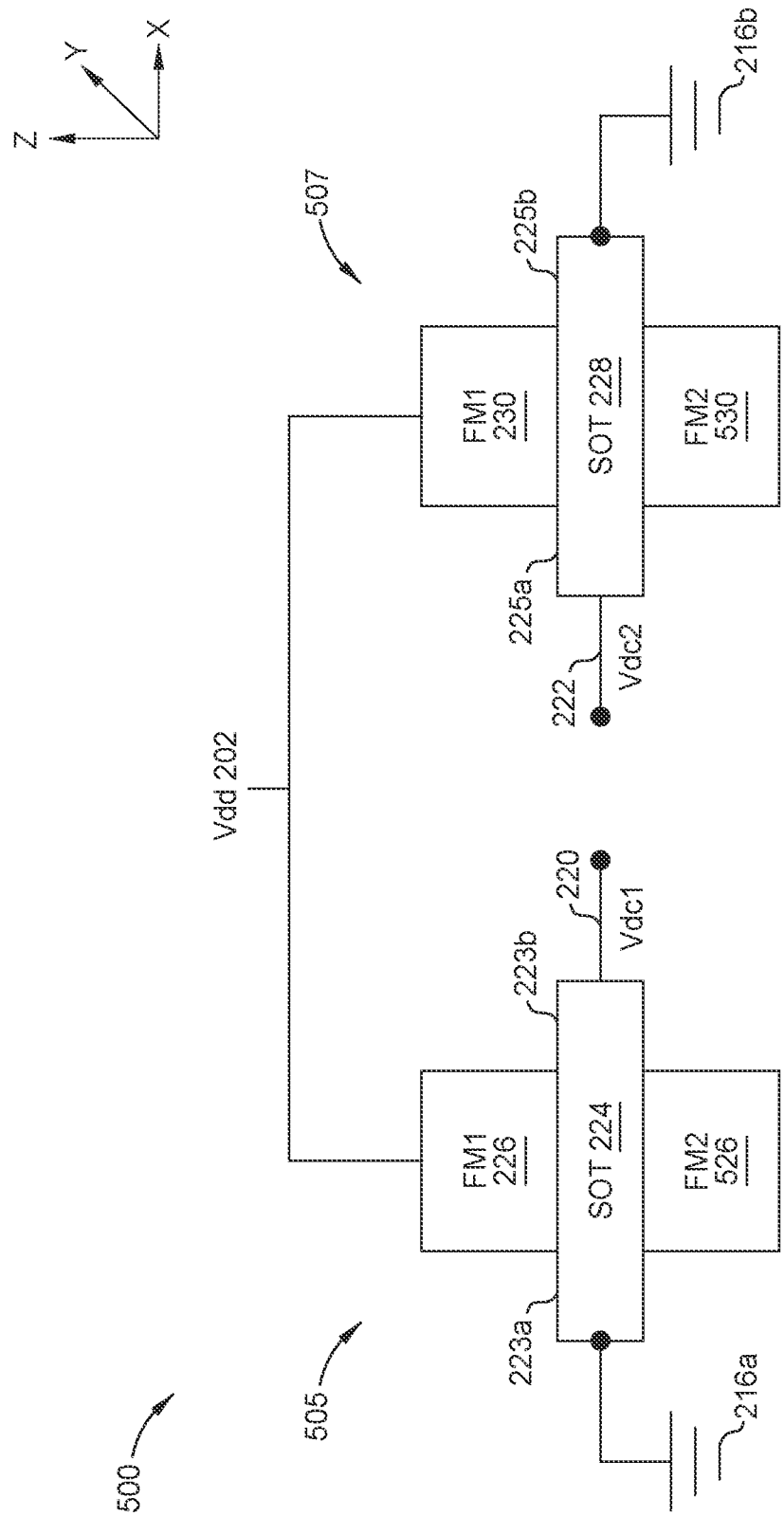
FIG. 5 is a schematic cross-sectional view illustration of a half bridge design according to another embodiment.

FIG. 5 is a schematic illustration of a half bridge circuit design 500 of a magnetic sensor, according to another embodiment. The half bridge circuit 500 may be referred to herein as a magnetic sensor 500.

The half bridge circuit 500 is similar to the half bridge circuit 200 of FIGS. 2A-2B such that the half bridge 500 design comprises a first leg 505 and a second leg 507. The first leg 505 is similar to the first leg 205, comprising the SOT layer 224 and a first FM layer (FM1) 226 disposed thereon. However, the first leg 505 further comprises a second FM layer (FM2) 526 disposed below the SOT layer 224 such that the SOT layer 224 is sandwiched between the first and second FM layers 226, 526. The first FM layer 226 is connected to the bias source 202. The first end 223a of the SOT layer 224 is connected to ground 216a, and the second end 223b of the SOT layer 224 is connected to the first voltage sensor 220.

Likewise, the second leg 507 is similar to the first leg 207, comprising the SOT layer 228 and a first FM layer (FM1) 230 disposed thereon. However, the first leg 507 further comprises a second FM layer (FM2) 530 disposed below the SOT layer 228 such that the SOT layer 228 is sandwiched between the first and second FM layers 230, 530. The first FM layer 230 is connected to the bias source 202. The first end 225a of the SOT layer 228 is connected to ground 216b, and the second end 225b of the SOT layer 228 is connected to the second voltage sensor 222.

The second FM layers 526, 530 may comprise the same materials as the first FM layers 226, 230, and have the same or different width 232 and height 233. The first and second legs 505, 507 may each individually comprise one or more SOT structures, like discussed above in FIGS. 3A-3B and shown in FIG. 6B. Moreover, the FM layers 226, 526, 230, 530 may be elliptical in shape. All SOT layers 226, 228 and FM layers 226, 526, 230, 530 can be deposited and fabricated on the same thin wafer. Further, all SOT layers and FM layers of both the first and second legs 505, 507 can be deposited and fabricated on the same thin wafer.

The bias source 202 provides perpendicular current passing through the FM layers 226, 230, 526, 530, getting spin polarized current and injecting into the SOT layers 224, 228 of the first and second legs 505, 507 (along the z-direction). Due to the inverse spin Hall effect (iSHE), a DC voltage is induced between the ground 216a, 216b and the first and second voltage sensors 220, 222 longitudinally (along the x-direction). The magnitude of the DC voltage depends on the magnetization of the FM layers 226, 230, 526, 530 in the y-direction. In the half bridge design 500, a first signal is induced at the interface between the first FM layer 226, 230 and the SOT layers 224, 228, and a second signal is induced at the interface between the second FM layers 526, 530 and the SOT layers 224, 229. The second voltage signal of the second FM layers 526, 530 has the same polarity at the first voltage signal of the first FM layers 226, 230, and hence the first and second voltage signals can be added together because both the spin current direction and spin-polarization are reversed.

When an external magnetic field is applied in the y-direction, the magnetizations of the FM layers 226, 230, 526, 530 will rotate such that at the first leg 505, the first voltage sensor 220 is greater than 0, and at the second leg 507, the second voltage sensor 222 is less than 0 (or vice versa), resulting in the voltage difference being doubled yet again. When no external magnetic field is applied or the applied field is along the x-direction, the magnetizations of the FM layers 226, 230, 526, 530 remain in the x-direction, resulting in no intrinsic signal output, as the first and second voltage sensors 220, 222 are equal (Vdc1=Vdc2). This way, the half bridge design 500 is only sensitive to a magnetic field along the y-direction and immune to magnetic fields in any other components. Additionally, any environmental/thermal drifts will cause the same changes (both magnitude and polarity) of Vdc1 and Vdc2, resulting in a net cancelation of the signal output.

Figure 6A:
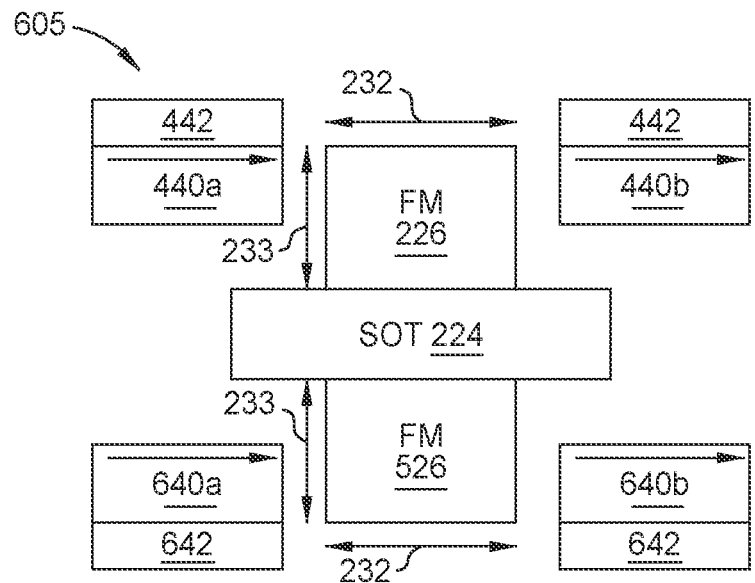
FIG. 6A is a schematic cross section illustration of a single ferromagnetic (FM) layer bridge according to one embodiment.

FIG. 6A is a schematic cross section illustration of a dual ferromagnetic (FM) layer bridge 605, according to one embodiment. The dual FM layer bridge 605 may be either the first leg 505 or the second leg 507 of FIG. 5. For clarity, ground, bias source, and voltage sensors are not shown in the FM layer bridge 605. However, the FM layer bridge 605 may be connected as discussed above in FIGS. 2A-3B and 5.

The FM layer bridge 605 comprises a first FM layer 226, a second FM layer 526, and the SOT layer 224 disposed therebetween (i.e., one SOT structure). The first FM layer 226 is sandwiched between a first bias layer 440a and a second bias layer 440b. The second FM layer 526 is sandwiched between a third bias layer 640a and a fourth bias layer 640b. The first, second, third, and fourth biasing layers 440a, 440b, 640a, 640b may be either hard bias layers or soft bias layers. For the case of soft bias material, there are additional AFM layers 442, 642 disposed on top of the first and second biasing layers 440a, 440b, and below the third and fourth biasing layers 640a, 640b for exchanging bias of the soft bias layer. For case of hard bias layers, the AFM layers 442, 642 can be skipped. The first, second, third, and fourth biasing layers 440a, 440b, 640a, 640b may each individually comprise any material disclosed above for the first and second biasing layers 440a, 440b. The first and second biasing layers 440a, 440b enable the first FM layer 226 to have a magnetization in the x-direction when there is no external field applied, and the third and fourth biasing layers 640a, 640b enable the second FM layer 526 to have a magnetization in the x-direction when there is no external field applied. The strength of the first, second, third, and fourth biasing layers 440a, 440b, 640a, 640b controls the dynamic range of the overall sensor comprising the FM layer bridge 605. An insulating layer may be disposed between the first FM layer 226 and the biasing layers 440a, 440b, and between the second FM layer 526 and the biasing layers 640a, 640b.

Figure 6B:
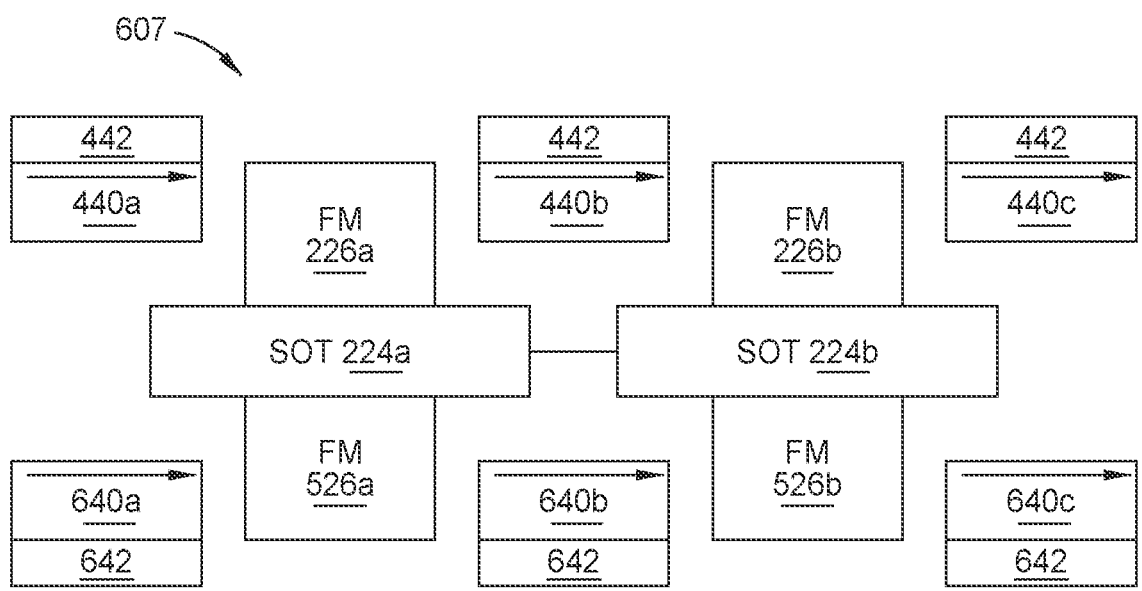
FIG. 6B is a schematic cross-sectional view of a leg having an array of sensors according to one embodiment.

FIG. 6B is a schematic cross-sectional view or bottom view of a leg 607 having more than one SOT structure, according to one embodiment. For clarity, ground, bias source, and voltage sensors are not shown in the leg 607. However, the leg 607 may be connected as discussed above in FIGS. 2A-3B and 5. The leg 607 may be either the first or second leg 505, 507 of FIG. 5.

The leg 607 is similar to the legs 505, 507 shown in FIG. 5. The leg 607 comprises a first FM layer 226a, a second FM layer 526a, and a first SOT layer 224a disposed therebetween, and a third FM layer 226b, a fourth FM layer 526b, and a second SOT layer 224b disposed therebetween. The first FM layer 226a is disposed between the first biasing layer 440a and the second biasing layer 440b. The third FM layer 226b is disposed between the second biasing layer 440b and a fifth biasing layer 440c. Thus, the first and third FM layers 226a, 226b can share the second biasing layer 440b, enabling the second biasing layer 440b to bias both the first and third FM layers 226a, 226b.

Similarly, the second FM layer 526a is disposed between the third biasing layer 640a and the fourth biasing layer 640b. The fourth FM layer 526b is disposed between the third biasing layer 640a and a sixth biasing layer 640c. Thus, the second and fourth FM layers 526a, 526b can share the fourth biasing layer 640b, enabling the fourth biasing layer 640b to bias both the second and fourth FM layers 526a, 526b. While two SOT structures are shown, the leg 607 may comprise any number of SOT structures.

Therefore, a magnetic sensor comprising only two legs is able to achieve the same functionality of the Wheatstone bridge array in a more simplistic and straight-forward manner while further being less complex to fabricate. Furthermore, because the half bridge circuit utilizes SOT structures without using TMR effect, it is less likely to breakdown over time (intrinsic reliability concern for TMR sensors). Moreover, in the half bridge design, the output of the two legs have opposite polarities, resulting in the signal of the half bridge design being doubled or boosted. Additionally, any environmental/thermal drifts will cause the same changes (both magnitude and polarity) of Vdc1 and Vdc2, resulting in a net cancelation of the drifts in the signal output.

In one embodiment, a half bridge circuit comprises a first spin-orbit torque (SOT) layer having a first end and a second end opposite the first end, a first ferromagnetic (FM) layer disposed on the first SOT layer, a first ground connected to the first end of the first SOT layer, a first voltage sensor connected to the second end of the first SOT layer, a bias source connected to the first FM layer, a second SOT layer having a first end and a second end opposite the first end, a second FM layer disposed on the second SOT layer, the second FM layer being connected to the bias source, a second ground connected to the second end of the second SOT layer, and a second voltage sensor connected to the first end of the second SOT layer.

The first voltage sensor is disposed adjacent to the second voltage sensor. A ratio of a width of the first FM layer to a height of the first FM layer is greater than or equal to 3, and wherein a ratio of a width of the second FM layer to a height of the second FM layer is greater than or equal to 3. The half bridge circuit further comprises a first biasing layer disposed adjacent to the first FM layer over the first end of the first SOT layer, a second biasing layer adjacent to the first FM layer over the second end of the first SOT layer, a third biasing layer disposed adjacent to the second FM layer over the first end of the second SOT layer, and a fourth biasing layer disposed adjacent to the second FM layer over the second end of the second SOT layer. The half bridge circuit further comprises a third FM layer disposed below the first SOT layer, and a fourth FM layer disposed below the second SOT layer. The first FM layer and the second FM layer are each individually rectangular or elliptical in shape. A magnetic sensor comprising the half bridge circuit.

In another embodiment, a half bridge circuit comprises a bias source, a first leg connected to the bias source, the first leg comprising one or more first spin-orbit torque (SOT) structures, each first SOT structure comprising: a first SOT layer having a first end and a second end opposite the first end, a first ferromagnetic (FM) layer disposed on the first SOT layer, a first ground connected to the first end of the first SOT layer, and a first voltage sensor connected to the second end of the first SOT layer, and a second leg connected to the bias source, the second leg comprising one or more second SOT structures, each second SOT structure comprising: a second SOT layer having a first end and a second end opposite the first end, a second FM layer disposed on the second SOT layer, a second ground connected to the second end of the second SOT layer, and a second voltage sensor connected to the first end of the second SOT layer.

The first leg comprises a plurality of first SOT structures connected in series, and the second leg comprises a plurality of second SOT structures connected in series. The bias source is connected to the first FM layer and to the second FM layer. The first SOT layer and the second SOT layer each individually comprises BiSb or YPtSb. The second end of the first SOT layer is disposed adjacent to the first end of the second SOT layer. The first FM layer is disposed between a first biasing layer and a second biasing layer, and wherein the second FM layer is disposed between a third biasing layer and a fourth biasing layer. A magnetic sensor comprising the half bridge circuit.

In yet another embodiment, a half bridge circuit comprises a bias source, a first leg connected to the bias source, the first leg comprising one or more first spin-orbit torque (SOT) structures connected in series, each first SOT structure comprising: a first SOT layer having a first end and a second end opposite the first end, a first ferromagnetic (FM) layer disposed on the first SOT layer, a second FM layer disposed below the first SOT layer, a first ground connected to the first end of the first SOT layer, and a first voltage sensor connected to the second end of the first SOT layer, and a second leg connected to the bias source, the second leg comprising one or more second SOT structures connected in series, each second SOT structure comprising: a second SOT layer having a first end and a second end opposite the first end, wherein the first end of the second SOT layer is disposed adjacent to the second end of the first SOT layer, a third FM layer disposed on the second SOT layer, a fourth FM layer disposed below the second SOT layer, a second ground connected to the second end of the second SOT layer, and a second voltage sensor connected to the first end of the second SOT layer.

A ratio of a width of the first FM layer to a height of the first FM layer is greater than or equal to 3, a ratio of a width of the second FM layer to a height of the second FM layer is greater than or equal to 3, a ratio of a width of the third FM layer to a height of the third FM layer is greater than or equal to 3, and a ratio of a width of the fourth FM layer to a height of the fourth FM layer is greater than or equal to 3. The first FM layer is disposed between a first biasing layer and a second biasing layer, the second FM layer is disposed between a third biasing layer and a fourth biasing layer, the third FM layer is disposed between a fifth biasing layer and a sixth biasing layer, and the fourth FM layer is disposed between a seventh biasing layer and an eighth biasing layer. The first, second, third, fourth, fifth, and sixth biasing layers are hard biasing layer. The first, second, third, fourth, fifth, and sixth biasing layers are soft biasing layer. A width of the first FM layer is greater than a height of the first FM layer, a width of the second FM layer is greater than a height of the second FM layer, a width of the third FM layer is greater than a height of the third FM layer, and a width of the fourth FM layer is greater than a height of the fourth FM layer. A magnetic sensor comprising the half bridge circuit.

While the foregoing is directed to embodiments of the present disclosure, other and further embodiments of the disclosure may be devised without departing from the basic scope thereof, and the scope thereof is determined by the claims that follow.

What is claimed is:

1. A half bridge circuit, comprising:
   a first spin-orbit torque (SOT) layer having a first end and a second end opposite the first end;
   a first ferromagnetic (FM) layer disposed on the first SOT layer;
   a first ground connected to the first end of the first SOT layer;
   a first voltage sensor connected to the second end of the first SOT layer;
   a bias source connected to the first FM layer;
   a second SOT layer having a first end and a second end opposite the first end;
   a second FM layer disposed on the second SOT layer, the second FM layer being connected to the bias source;
   a second ground connected to the second end of the second SOT layer; and
   a second voltage sensor connected to the first end of the second SOT layer.

2. The half bridge circuit of claim 1, wherein the first voltage sensor is disposed adjacent to the second voltage sensor.

3. The half bridge circuit of claim 1, wherein a ratio of a width of the first FM layer to a height of the first FM layer is greater than or equal to 3, and wherein a ratio of a width of the second FM layer to a height of the second FM layer is greater than or equal to 3.

4. The half bridge circuit of claim 1, further comprising:
   a first biasing layer disposed adjacent to the first FM layer over the first end of the first SOT layer;
   a second biasing layer disposed adjacent to the first FM layer over the second end of the first SOT layer;
   a third biasing layer disposed adjacent to the second FM layer over the first end of the second SOT layer; and
   a fourth biasing layer disposed adjacent to the second FM layer over the second end of the second SOT layer.

5. The half bridge circuit of claim 1, further comprising:
   a third FM layer disposed below the first SOT layer; and
   a fourth FM layer disposed below the second SOT layer.

6. The half bridge circuit of claim 1, wherein the first FM layer and the second FM layer are each individually rectangular or elliptical in shape.

7. A magnetic sensor comprising the half bridge circuit of claim 1.

8. A half bridge circuit, comprising:
   a bias source;
   a first leg connected to the bias source, the first leg comprising one or more first spin-orbit torque (SOT) structures, each first SOT structure comprising:
      a first SOT layer having a first end and a second end opposite the first end;
      a first ferromagnetic (FM) layer disposed on the first SOT layer;
      a first ground connected to the first end of the first SOT layer; and
      a first voltage sensor connected to the second end of the first SOT layer; and
   a second leg connected to the bias source, the second leg comprising one or more second SOT structures, each second SOT structure comprising:
      a second SOT layer having a first end and a second end opposite the first end;
      a second FM layer disposed on the second SOT layer;
      a second ground connected to the second end of the second SOT layer; and
      a second voltage sensor connected to the first end of the second SOT layer.

9. The half bridge circuit of claim 8, wherein the first leg comprises a plurality of first SOT structures connected in series, and the second leg comprises a plurality of second SOT structures connected in series.

10. The half bridge circuit of claim 8, wherein the bias source is connected to the first FM layer and to the second FM layer.

11. The half bridge circuit of claim 8, wherein the first SOT layer and the second SOT layer each individually comprises BiSb or YPtSb.

12. The half bridge circuit of claim 8, wherein the second end of the first SOT layer is disposed adjacent to the first end of the second SOT layer.

13. The half bridge circuit of claim 8, wherein the first FM layer is disposed between a first biasing layer and a second biasing layer, and wherein the second FM layer is disposed between a third biasing layer and a fourth biasing layer.

14. A magnetic sensor comprising the half bridge circuit of claim 8.

15. A half bridge circuit, comprising:
   a bias source;
   a first leg connected to the bias source, the first leg comprising one or more first spin-orbit torque (SOT) structures connected in series, each first SOT structure comprising:
      a first SOT layer having a first end and a second end opposite the first end;
      a first ferromagnetic (FM) layer disposed on the first SOT layer;
      a second FM layer disposed below the first SOT layer;
      a first ground connected to the first end of the first SOT layer; and
      a first voltage sensor connected to the second end of the first SOT layer; and
   a second leg connected to the bias source, the second leg comprising one or more second SOT structures connected in series, each second SOT structure comprising:
      a second SOT layer having a first end and a second end opposite the first end, wherein the first end of the second SOT layer is disposed adjacent to the second end of the first SOT layer;
      a third FM layer disposed on the second SOT layer;
      a fourth FM layer disposed below the second SOT layer;
      a second ground connected to the second end of the second SOT layer; and
      a second voltage sensor connected to the first end of the second SOT layer.

16. The half bridge circuit of claim 15, wherein:
   a ratio of a width of the first FM layer to a height of the first FM layer is greater than or equal to 3;
   a ratio of a width of the second FM layer to a height of the second FM layer is greater than or equal to 3;
   a ratio of a width of the third FM layer to a height of the third FM layer is greater than or equal to 3; and
   a ratio of a width of the fourth FM layer to a height of the fourth FM layer is greater than or equal to 3.

17. The half bridge circuit of claim 15, wherein:
   the first FM layer is disposed between a first biasing layer and a second biasing layer;
   the second FM layer is disposed between a third biasing layer and a fourth biasing layer;
   the third FM layer is disposed between a fifth biasing layer and a sixth biasing layer; and
   the fourth FM layer is disposed between a seventh biasing layer and an eighth biasing layer.

18. The half bridge circuit of claim 17, wherein the first, second, third, fourth, fifth, and sixth biasing layers are hard biasing layer.

19. The half bridge circuit of claim 17, wherein the first, second, third, fourth, fifth, and sixth biasing layers are soft biasing layer.

20. The half bridge circuit of claim 15, wherein:
   a width of the first FM layer is greater than a height of the first FM layer;
   a width of the second FM layer is greater than a height of the second FM layer;
   a width of the third FM layer is greater than a height of the third FM layer; and
   a width of the fourth FM layer is greater than a height of the fourth FM layer.

21. A magnetic sensor comprising the half bridge circuit of claim 15.

* * * * *